(12) United States Patent
Mehta et al.

(10) Patent No.: US 8,682,315 B2
(45) Date of Patent: Mar. 25, 2014

(54) PREDISTORTION SYSTEM AND METHOD BASED ON LOOK UP TABLE INTERPOLATION

(75) Inventors: Jaimin A. Mehta, Plano, TX (US); Vasile Zoicas, La Gaude (FR); Sameh Rezeq, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1265 days.

(21) Appl. No.: 11/958,566

(22) Filed: Dec. 18, 2007

(65) Prior Publication Data

US 2009/0051425 A1    Feb. 26, 2009

Related U.S. Application Data

(60) Provisional application No. 60/957,594, filed on Aug. 23, 2007.

(51) Int. Cl.
*H04W 4/00* (2009.01)

(52) U.S. Cl.
USPC .................. 455/426.2; 455/114.1; 455/114.3; 455/126

(58) Field of Classification Search
USPC ............................................. 455/426, 426.2
See application file for complete search history.

(56) References Cited

U.S. PATENT DOCUMENTS

| | | | |
|---|---|---|---|
| 6,304,140 B1* | 10/2001 | Thron et al. | 330/149 |
| 2002/0016154 A1* | 2/2002 | Huttunen | 455/63 |
| 2004/0252773 A1* | 12/2004 | Dinur | 375/260 |
| 2004/0252783 A1* | 12/2004 | Kim et al. | 375/296 |
| 2005/0117756 A1* | 6/2005 | Shigyo et al. | 381/98 |
| 2006/0109930 A1* | 5/2006 | O'Sullivan et al. | 375/296 |
| 2007/0190952 A1* | 8/2007 | Waheed et al. | 455/114.3 |
| 2007/0216480 A1* | 9/2007 | Benedict | 330/149 |

* cited by examiner

*Primary Examiner* — Ajibola Akinyemi
(74) *Attorney, Agent, or Firm* — Ronald O. Nerrings; Wade James Brady; Frederick J. Telecky, Jr.

(57) ABSTRACT

A system comprising a pre-power amplifier and a hardware device which is configured to predistort an amplitude input signal by comparing interpolated data places, determined by comparing the input signal with data from a LUT, coming from a LUT with the amplitude input signal and choosing the closest input data place to the amplitude input signal to produce an amplitude predistortion output signal. The LUT contains predistortion data associated with the pre-power amplifier. The amplitude input signal is multiplied and scaled prior to being compared with the data in the LUT. A second LUT is used to predistort a phase input signal and the phase predistortion output signal is combined in the pre-power amplifier with the amplitude predistortion output signal. The system may be implemented in a mobile communications device.

19 Claims, 6 Drawing Sheets

PREDISTORTION SYSTEM AND METHOD BASED ON LOOK UP TABLE INTERPOLATION

CROSS-REFERENCE TO RELATED APPLICATIONS

This application claims the benefit of Provisional Application Ser. No. 60/957,594 filed Aug. 23, 2007, titled "A Pre-Distortion Method for Edge Modulation Based on LUT Interpolation and Searching Mechanism," which is hereby incorporated by reference.

BACKGROUND

The performance of a notional ideal pre-power amplifier results in a straight-linear-line relationship of input voltage (or input digital code word) to output voltage. However, practical pre-power amplifiers depart from the linear characteristic of the ideal pre-power amplifier by distorting and compressing the voltage output. The practical pre-power amplifier also distorts the phase output as well. Because pre-power amplifiers act as an amplitude and phase combiner, the resulting signal has distortions that violate integrated circuit specifications (e.g., error vector magnitude and modulation spectrum). "Predistortors" have been suggested that attempt to predistort the input signal so that the output signal follows a linear relationship. Previous predistortors, however, tend to use difficult inverse function calculations to determine the predistortion curve needed to achieve linearity. Thus, it would be desirable to design a system that predistorts the signal input in such a way that avoids difficult calculations.

SUMMARY

The problems noted above are solved in large part by a system and method for predistorting signals that are transmitted through a pre-power amplifier. In some embodiments, the system includes a pre-power amplifier and a hardware device. The hardware device is configured to predistort an amplitude input signal by comparing interpolated data places from a look-up table ("LUT") with the amplitude input signal and choosing the closest input data place to the amplitude input signal to produce an amplitude predistortion output signal. The input data places are determined by comparing the input signal with the data in the LUT. The LUT contains predistortion data associated with the pre-power amplifier. The amplitude input signal is multiplied and scaled prior to being compared with the data in the LUT. A second LUT is used to predistort a phase input signal and the phase predistortion output signal is combined in the pre-power amplifier with the amplitude predistortion output signal. The system may be implemented in a mobile communications device.

Another illustrative embodiment includes a method that comprises comparing an amplitude input signal with values in a LUT to produce input data places, interpolating the input data places from the LUT, comparing the amplitude input signal with the interpolated input data places, and locating the closest input data place to the amplitude input signal to produce an amplitude predistortion output. The method also includes multiplying the amplitude input signal by a power level and scaling the multiplied amplitude input signal to the same number of bits as bits in the LUT. The method further comprises adding interpolated input data places from a second LUT with a phase input signal to produce a phase predistortion output. The method also includes combining the amplitude predistortion output with the phase predistortion output.

Yet another illustrative embodiment includes a predistortion logic system comprising a hardware device configured to predistort a signal using a LUT. The LUT comprises compression data associated with a pre-power amplifier. The hardware device is also configured to compare data from the LUT with the signal and choose a closest data point from the LUT to the signal to produce a predistortion signal, combine the signal with the predistortion signal, multiply the signal by a power level, scale the multiplied signal by lowering the multiplied signal to the same number of bits as bits in the LUT, and produce a phase predistortion signal using a second LUT.

BRIEF DESCRIPTION OF THE DRAWINGS

For a detailed description of various disclosed embodiments, reference will now be made to the accompanying drawings in which.

NOTATION AND NOMENCLATURE

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct electrical connection. Thus, if a first device couples to a second device, that connection may be through a direct electrical connection, or through an indirect electrical connection via other devices and connections.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to suggest that the scope of the disclosure, including the claims, is limited to that embodiment.

Figure 1:
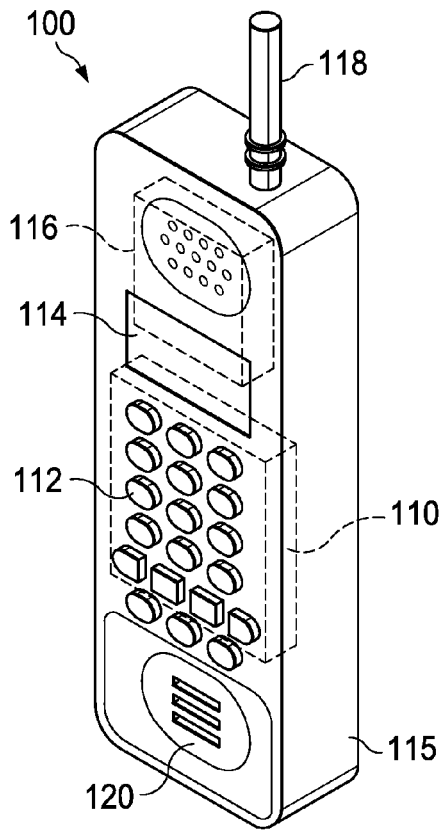
FIG. 1 shows an illustrative mobile communication device implementing the technique disclosed herein, in accordance with preferred embodiments of the invention.

FIG. 1 shows an illustrative mobile communication device 100 (e.g., a mobile phone) implementing the disclosed technique in accordance with various embodiments of the invention. The device 100 comprises a battery-operated device which includes an integrated keypad 112 and display 114. The device 100 also includes an electronics package 110 coupled to the keypad 112, display 114, and radio frequency ("RF") circuitry 116. The electronics package 110 contains various electronic components used by the device 100, including processing logic, storage logic, etc. The RF circuitry 116 may couple to an antenna 118 by which data transmissions are sent and received. The device 100 also comprises a microphone 120. Although the mobile communication device 100 is represented as a mobile phone in FIG. 1, the scope of disclosure is not limited to mobile phones and also may include personal digital assistants, multi-purpose audio devices, portable computers or any other suitable electronic device. In at least some embodiments, the disclosed technique may be used in devices other than mobile communication devices. In preferred embodiments, the device 100 operates in a Global System for Mobile Communications (GSM) network.

Figure 2:
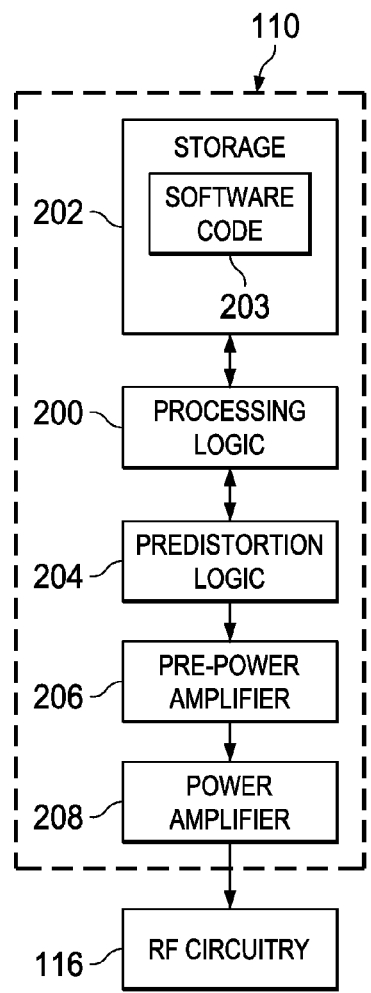
FIG. 2 shows an illustrative block diagram of at least some of the contents of the mobile communication device of FIG. 1, in accordance with embodiments of the invention.

FIG. 2 shows at least some of the contents of the electronics package 110. The electronics package 110 comprises processing logic 200, storage 202 comprising software code 203, predistortion logic 204, a pre-power amplifier 206, and a power amplifier 208. The storage 202 may comprise a processor (e.g., computer) readable medium such as volatile memory (e.g., random access memory), non-volatile storage (e.g., read-only memory, a hard drive, Flash memory, etc), or combinations thereof. Storage 202 may be a single storage unit or a plurality of discrete storage units of the same or different types.

Predistortion logic 204 is configured to predistort signals that are to be passed on to RF circuitry 116 via pre-power amplifier 206 and power amplifier 208. Predistortion logic 204 predistorts signals in such a way so as to account for most of all distortion that occurs in pre-power amplifier 206. Pre-power amplifier 206 is an electronic amplifier which is used to prepare signals for further amplification by power amplifier 208. Pre-power amplifier 206 receives a phase and amplitude signal from predistortion logic 204 and combines them into one signal. Once a signal has undergone pre-amplification in pre-power amplifier 206, the signal passes to power amplifier 208 for further amplification, and finally passed to RF circuitry 116 to be transmitted.

Figure 3:
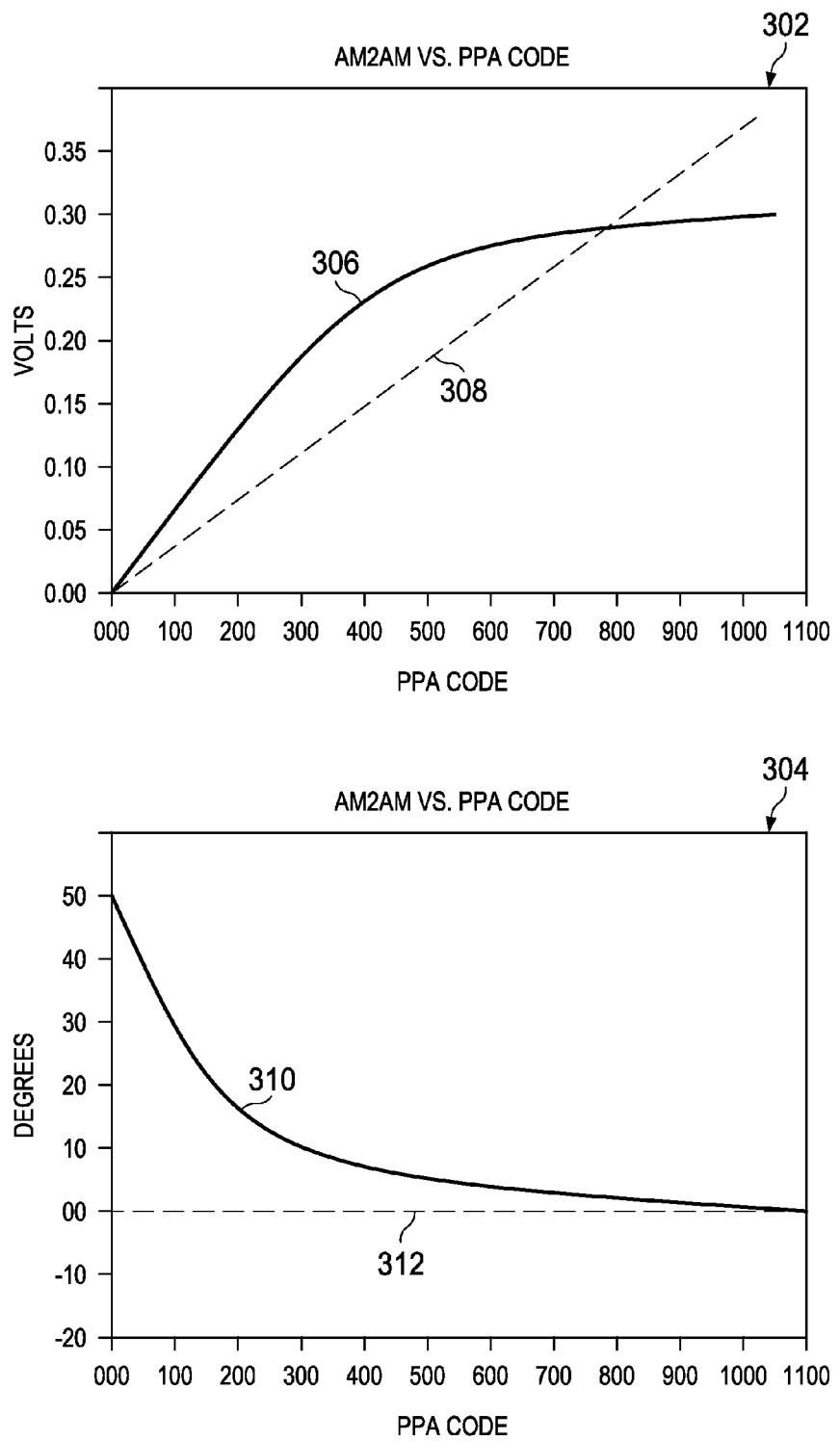
FIG. 3 shows an illustrative diagram of the problem solved.

FIG. 3 shows an overview of the problem solved. Graph 302 shows an illustrative view of pre-power amplifier's 206 output in volts versus pre-power amplifier digital code word. A digital code word is a binary representation of certain sections of a coded and modulated analog audio signal. In the preferred embodiment, the digital code words comprise 10 bits; however, the digital code words may be any number of bits. Thus, the coded and modulated analog audio signal which needs amplification, is represented by numerous binary digital code words. Curve 306 shows the non-linearity of how pre-power amplifier 206 compresses the output signal. Curve 306 becomes more compressed the higher the number of pre-power amplifier digital code words used. Ideally, the output of the pre-power amplifier would be straight line 308.

Graph 304 illustrates the phase response of pre-power amplifier 206. Curve 310 shows how the pre-power amplifier compresses the phase output, in a similar manner as the amplitude output. Straight line 312 is the ideal output for the phase input into the pre-power amplifier. Because pre-power amplifier 206 acts as an amplitude and phase combiner, the resulting distortions in the output signal violates integrated circuit specifications (e.g., error-vector-magnitude and close-in modulation spectrum).

Figure 4:
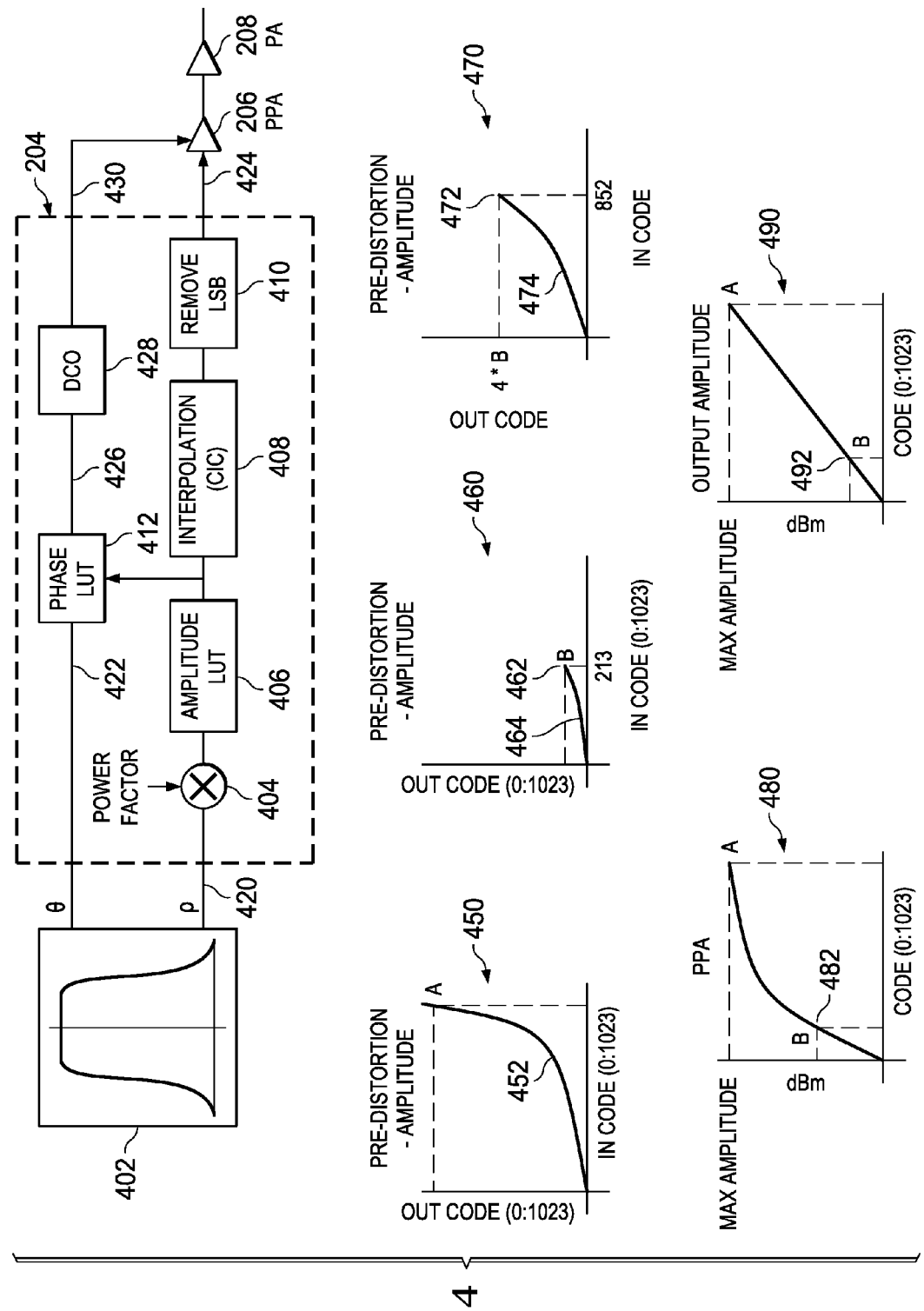
FIG. 4 shows an illustrative block diagram of at least some of the contents of the predistortion logic, in accordance with embodiments of the invention.

FIG. 4 shows an illustrative block diagram of at least some of the contents of predistortion logic 204. Polar transmitter 402 is configured to transmit both a phase (θ) input signal 422 and an amplitude (ρ) input signal 420 to be combined by pre-power amplifier 206 from FIG. 2. Amplitude input signal 420 preferably is a 10 bit signal and is multiplied by multiplier 404 prior to entering a look-up table ("LUT") 406. Multiplier 404 is configured to multiply amplitude input signal 420 by a power factor. The power factor is a digital code corresponding to the power level which is to be transmitted at. It is stored into a table during power level calibration of the RF circuitry 116. At this point, multiplied amplitude input signal 420 is compared with data in LUT 406. LUT 406 is preprogrammed with the amplitude predistortion data based on the compression data of pre-power amplifier 206 prior to use. LUT 406 behaves similar to content address memory in other applications.

Graph 450 is a representation of the main amplitude predistortion curve 452 as input digital code versus output digital code. Thus, when a digital code word is compared with data in the LUT, at a certain input level, the output from the LUT will be found on the y-axis at the intersection of the input level (x-axis) and predistortion curve 452 as a digital code word. Curve 452 is the "inverse" of curve 306, the amplitude compression curve from pre-power amplifier 206, from FIG. 3. Thus, when curve 452 is combined with curve 306, a straight line output 308 is the result. As a result, when a predistorted signal is inputted into pre-power amplifier 206, the output will be linear. LUT 406 only is preprogrammed with a certain number of data points from amplitude predistortion curve 452 (e.g., 256 values). This will result in less memory being used than if the entire amplitude predistortion curve 452 were loaded into LUT 406.

At this point the output of LUT 406, the amplitude predistorted output signal enters a cascaded integrator comb filter ("CIC") 408 for interpolation. CIC 408 adds bits to the signal for resolution to meet the far output noise requirements of the system. However, these extra bits do not add any value to the close in spectral quality. The least significant bits at the output of CIC 408 are removed from the signal in block 410. From block 410, the amplitude predistorted output signal 424 enters pre-power amplifier 206 carrying 10 bits of amplitude resolution from polar transmitter 402 all the way to pre-power amplifier 206 for any power level.

For example, if a user wished to transmit at output power B, shown as point 492 on graph 490, point 482 on graph 480 would be the output power without predistortion. Graph 490 shows the output amplitude versus inputted digital code word of the ideal pre-power amplifier without any compression. Graph 490 shows the output result in amplitude from a practical pre-power amplifier. Predistortion is necessary so that the output of the pre-power amplification results in point 492. Once amplitude input signal 420 enters into LUT 406 predistortion curve 452 is used to determine output. Graph 460 shows the portion of predistortion curve 452 that is needed to transmit at amplitude level B as curve 464. However, because the operational amplitude level needed is at point 462 on graph 460, a level that is less than full amplitude, the full 10-bits of amplitude input signal 420 cannot be used, thus resolution is sacrificed. In fact, as seen in graph 460, amplitude input resolution is only 7 to 8 bits which results in marginal spectral quality at power amplifier 208 output. To overcome this, curve 464 is linearly interpolated by a factor of $2^4$. Graph 470 shows the predistortion curve after interpolation as curve 474. Now point 472, which corresponds to point 462, is between 9 and 10 bits which is important for keeping satisfactory spectral quality at power amplifier 208 output.

Referring still to FIG. 4, polar transmitter 402 also transmits phase input signal 422 into a second LUT 412 preprogrammed with the phase predistortion curve based on compression data of pre-power amplifier 206 prior to implementation. The phase predistortion curve is the inverse of curve 310, the phase compression curve from pre-power amplifier 206 shown in FIG. 3. Thus, when the phase predistortion curve is combined with curve 310, a straight line output 312 is the result. After LUT 412 is used to predistort phase input signal 422, to form a phase predistortion output signal, this phase predistortion output signal 426 is used to modulate an RF carrier by using Digital Controlled Oscillator (DCO) 428. Once this is complete, a modulated carrier output signal 430 is sent to pre-power amplifier 206. Pre-power amplifier 206 then combines the amplitude predistortion output 424 signal and the modulated carrier output signal 430 and sends the signal to power amplifier 208 for further amplification.

Figure 5:
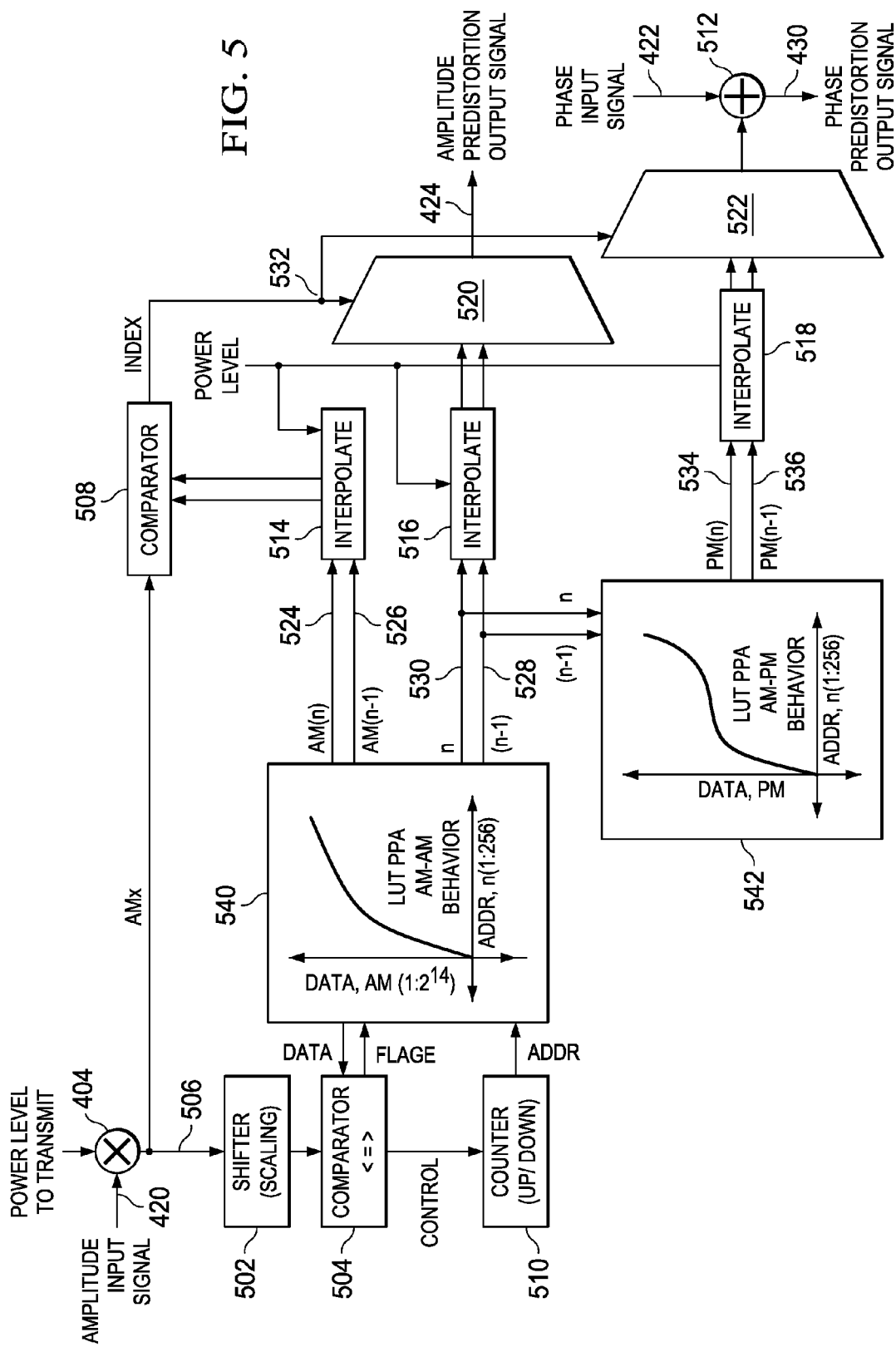
FIG. 5 shows an illustrative block diagram of the predistortion logic in detail, in accordance with embodiments of the invention.

FIG. 5 shows an alternative embodiment as an illustrative block diagram of the predistortion logic 204 in detail. Amplitude input signal 420 is multiplied by the power level in which the user wants to transmit by multiplier 404. Shifter 502 scales the multiplied amplitude input signal 506 to the same number of bits as the number of bits in LUT 540. This is accomplished by eliminating the least significant bits after the multiplication of amplitude input signal 420. The scaled amplitude input signal is then sent to comparator 504. Comparator 504 compares the scaled amplitude input signal with the output of LUT 540. In this embodiment, LUT 540 stores the amplitude compression curve 306 data points. Thus, the output of LUT 540 is data points from the amplitude compression curve 306 data that is previously stored in LUT 540. As described above, the output of LUT 540 is a predistorted digital code word. Counter 510 begins with a count of 0. If the output of LUT 540 is greater than the scaled amplitude input signal value, then counter 510 decreases its count by one. However, if the output of LUT 540 is less than the scaled amplitude input signal value, then counter 510 increases its count by one. This comparison by comparator 504 repeats until the value of the scaled amplitude input signal is equal to the output of LUT 540 or is between two consecutive values of the output of LUT 540.

At this point, two LUT input data places, 524 and 526 are passed to interpolator 514. Also, predistortion curve indexes 528 and 530 are passed to interpolator 516. Input data places 524 and 526 correspond to the amplitude, x-axis points on the amplitude compression curve 306 for pre-power amplifier 206 which is stored in LUT 540 for which the scaled amplitude input signal fell between. The predistortion curve indexes 528 and 530 correspond to the y-axis points on the amplitude compression curve 306 for which the scaled amplitude input signal fell between.

The input data places 524 and 526 are interpolated at this point. After the interpolation has been completed by interpolator 514, input data places 524 and 526 are sent to comparator 508 to be compared with multiplied amplitude input signal 506. Comparator 508 chooses which of the interpolated input data places 524 or 526 is closest to the multiplied amplitude input signal 506. During the same time period, predistortion curve indexes 528 and 530 are interpolated by interpolator 516. At this point, the closest interpolated input data place 532 is fed into multiplexer 520 as the multiplexerd's 520 control signal along with the interpolated predistortion curve indexes 528 and 530. The output of the multiplexer is amplitude predistortion output signal 424.

Predistortion curve indexes 528 and 530 are also fed into LUT 542 which contains phase compression curve data based on phase compression curve 310. Aligning predistortion curve indexes 528 and 530 along the x-axis, the y-axis phase input data places 534 and 536 are discovered. Phase input data places 534 and 536 are interpolated by interpolator 518 and passed to multiplexer 522 along with the closest interpolated input data place 532. The output of multiplexer 522 is added to phase input signal 422 to produce phase modulated carrier output signal 430.

Figure 6:
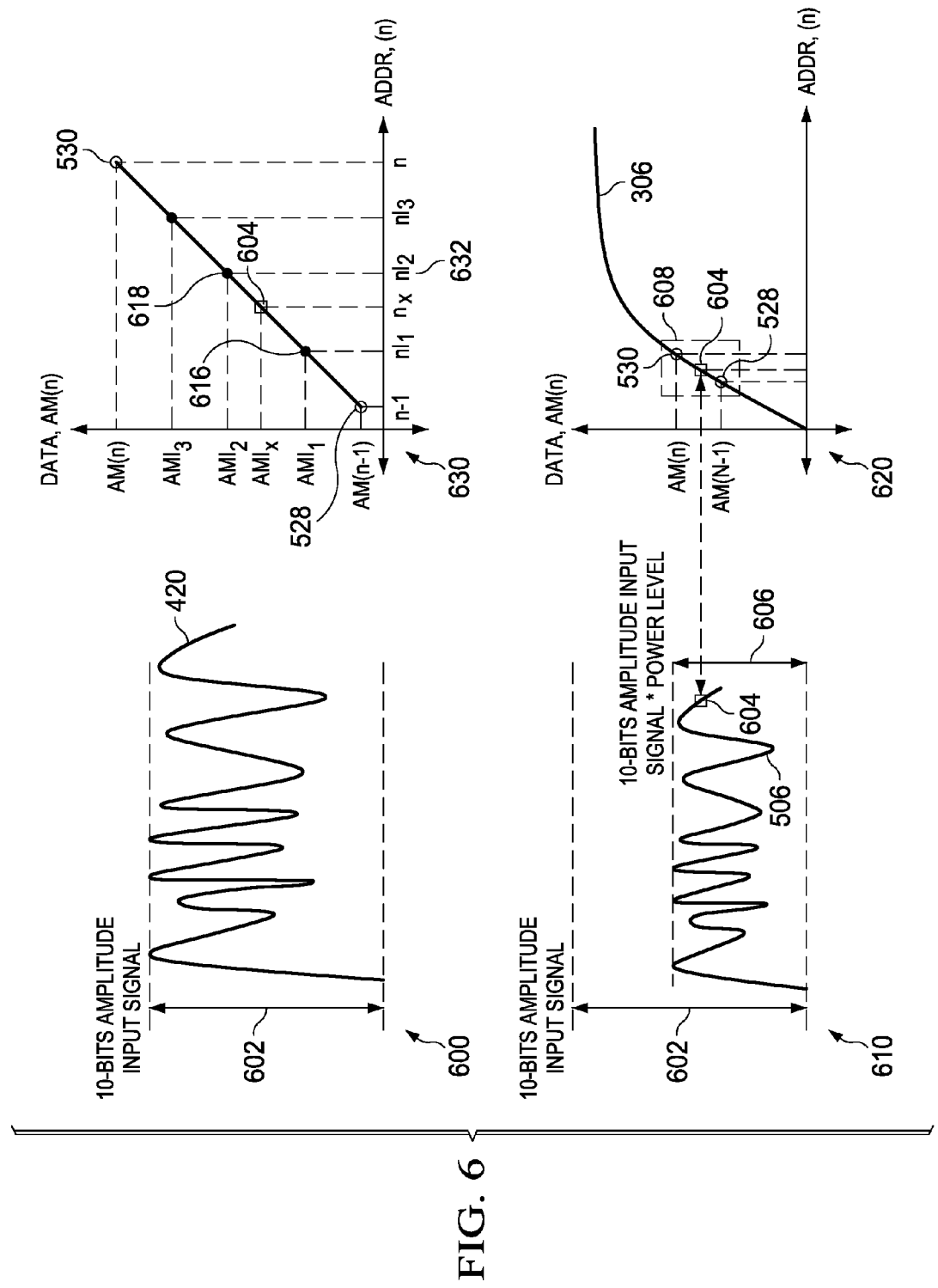
FIG. 6 shows a conceptual illustration of the technique disclosed herein, in accordance with embodiments of the invention.

FIG. 6 illustrates the disclosed technique. In graph 600, amplitude input signal 420 is transmitted by polar transmitter 402. Line 602 illustrates that amplitude input signal 420 was transmitted at 10 bits. Graph 610 shows amplitude input signal 420 after being multiplied by multiplier 404 which produces multiplied amplitude input signal 506. Multiplier 404 multiplies amplitude input signal 420 by the power level that is desirable to transmit at. This power level is a fraction of the full power available. For instance, a power level of one would equate to transmitting at full power. A power level of 0.5 would equate to transmitting at half power. The power level is treated as 8 bits when it is multiplied producing an 18 bit multiplied amplitude input signal 506. This is where shifter 502 drops the 8 least significant bits so that a 10 bit signal is compared with LUT 540 output.

In this example, the user wishes to transmit point 604 of multiplied amplitude input signal 506. As seen on graph 620, after point 604 has gone through comparator 504, point 604 will have been found to lie between AM(n−1), input data place 526, and AM(n), input data place 524, coming from LUT 540. As mentioned previously, input data places 524 and 526 lie on phase compression curve 306 which is preprogrammed into LUT 540. Input data places 524 and 526, along with predistortion curve indexes 528 and 530, are interpolated by interpolators 514 and 516 respectively. In this example, the interpolation factor is 4 as can be seen in graph 630. At this point, input data places 524 and 526 pass into comparator 508 where they are compared with multiplied amplitude input signal 506 at point 604. In this example, point 604 lies between point 616 and 618 of the interpolated input data places 524 and 526. Because point 618 is closer to point 604 than point 616, point 618, $AMI_2$, is chosen as the amplitude predistortion output signal 424.

Figure 7:
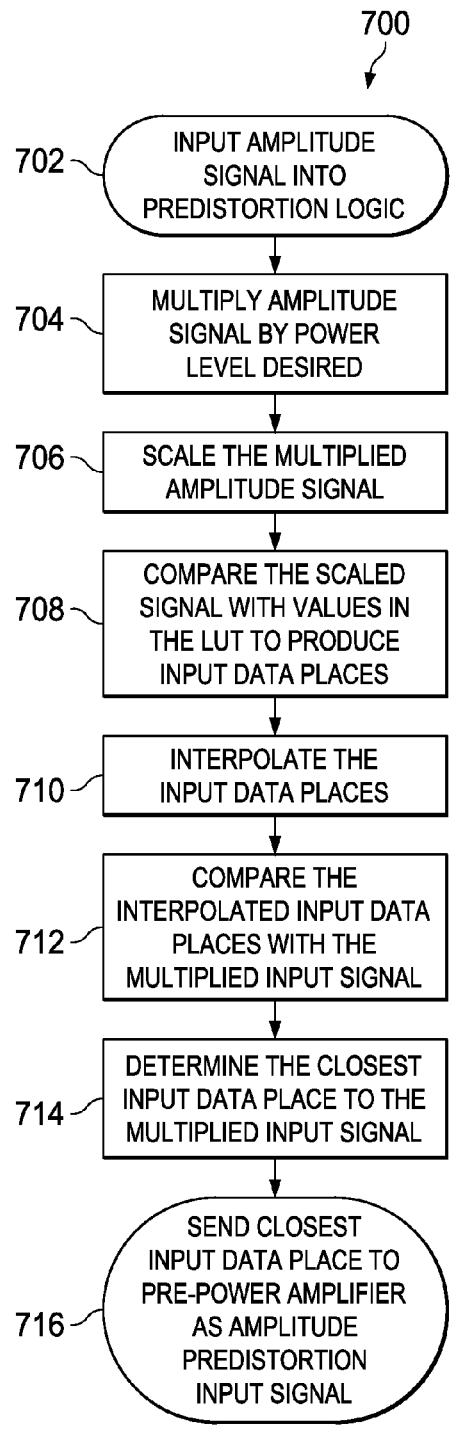
FIG. 7 shows an illustrative flow diagram of a method implemented in accordance with embodiments of the invention.

FIG. 7 shows an illustrative flow diagram of a method 700 implemented in accordance with various embodiments of the invention. The order of the steps in FIG. 7 can be varied from that shown and some steps may be performed in parallel. Method 700 begins by transmitting amplitude input signal 420 into predistortion logic 204 in block 702. In block 704, amplitude input signal 420 is multiplied by a desired power level to produce the multiplied amplitude input signal 506. After amplitude input signal 420 is multiplied, the signal is then scaled in block 706 so that multiplied input signal 506 has the same number of bits as LUT 540. In block 708, the scaled multiplied amplitude input signal 506 is compared by comparator 504 with input data places in LUT 540 to determine input data places 524 and 526. As explained above, input data places 524 and 526 are the x-axis points of preprogrammed amplitude compression curve data from pre-amplifier 206 which bracket the multiplied amplitude input signal 506 point which is to be transmitted.

Input data places 524 and 526 are then interpolated by interpolator 514 in block 710. Once input data places 524 and 526 have been interpolated, they are compared with multiplied amplitude input signal 506 by comparator 508, as seen in block 712. At this point, the closest input data place 524 or 526 to the multiplied amplitude input signal 506 is chosen in block 714. The closest input data place 524 or 526 is then passed to pre-power amplifier 206 as amplitude predistortion output signal 424 as shown in block 716.

It is noted here that predistortion hardware such as that disclosed herein creates several potential advantages. The use of look-up tables in creating the predistortion curve makes for easy implementation because no intensive computations are required to find the inverse of the compression curve. This also leads to the advantage of saving power which would have been used in completing the inverse function computation. Because the LUT only stores a certain number of stored points, a reduced number from the prior art, by using efficient distributed spacing of LUT samples, die area for any integrated circuit is reduced. This also provides for flexibility in choosing the LUT sample spacing. Another advantage of this type of predistortion hardware is that the LUT need not be changed for power control level changes. Thus, the same LUT is used no matter what power level is used in the operation of the system. The systems and methods described herein also have the advantage of having programmable resolution enhancement when operating in a lower power mode.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A system comprising:
   a pre-power amplifier; and
   a hardware device configured to predistort an input signal by:
   interpolating input data places provided from a look-up table ("LUT") thereby generating interpolated input data places; and
   comparing the interpolated input data places with the input signal and choosing a closest of the input data places to the input signal to produce a predistortion output signal;
   wherein the LUT comprises predistortion data associated with the pre-power amplifier, and
   wherein the input data places comprise x-axis points of preprogrammed amplitude compression curve data.

2. The system of claim 1, wherein the hardware device is further configured to compare the input signal with data in the LUT to determine the input data places.

3. The system of claim 1, wherein the hardware device is further configured to multiply the input signal by a power level to produce a multiplied input signal.

4. The system of claim 3, wherein the hardware device is further configured to scale the multiplied input signal by lowering the multiplied input signal to the same number of bits as bits in the LUT.

5. The system of claim 1, wherein the input signal is an amplitude input signal.

6. The system of claim 5, wherein the predistortion output signal is an amplitude predistortion output signal.

7. The system of claim 5, wherein the hardware device is further configured to add an interpolated input data place from a second LUT with an input phase signal to produce a phase predistortion output signal.

8. The system of claim 7, wherein the pre-power amplifier is configured to combine the amplitude predistortion output signal and the phase predistortion output signal.

9. The system of claim 1 wherein the system further comprises a mobile communications device.

10. A method comprising:
    comparing an input signal with values in a LUT to produce input data places;
    interpolating the input data places from the LUT;
    comparing the input signal with the interpolated input data places; and
    locating the closest input data place to the input signal to produce a predistortion output,
    wherein the input data places comprise x-axis points of preprogrammed amplitude compression curve data.

11. The method of claim 10, further comprising:
    multiplying the input signal by a power level to produce a multiplied input signal; and
    scaling the multiplied input signal to the same number of bits as bits in the LUT.

12. The method of claim 10, wherein the input signal is an amplitude input signal and the predistortion output is an amplitude predistortion output.

13. The method of claim 12, further comprising:
    adding an interpolated input data place from a second LUT with a phase input signal to produce a phase predistortion output signal.

14. The method of claim 13, further comprising:
    combining the amplitude predistortion output signal and the phase predistortion output signal.

15. A predistortion logic system comprising:
    a hardware device configured to predistort a signal using a LUT,
    wherein the LUT comprises predistortion data associated with a pre-power amplifier;
    wherein the hardware device is further configured to:
    interpolate input data places from the LUT to generate a plurality of interpolated input data places;
    compare the plurality of interpolated input data places with the signal; and
    choose, based on the comparison, a closest one of the plurality of interpolated input data places to the signal to produce a predistortion signal.

16. The predistortion logic system of claim 15, wherein the hardware device is further configured to multiply the signal by a power level to produce a multiplied signal.

17. The predistortion logic system of claim 16, wherein the hardware device is further configured to scale the multiplied signal by lowering the multiplied signal to the same number of bits as bits in the LUT.

18. The predistortion logic system of claim 15, wherein the hardware device is further configured to produce a phase predistortion signal using a second LUT.

19. The predistortion logic system of claim 15, wherein the hardware device is implemented in a mobile communications device.

* * * * *